US006366510B2

United States Patent
Fibranz

(10) Patent No.: US 6,366,510 B2
(45) Date of Patent: Apr. 2, 2002

(54) ELECTRONIC MEMORY DEVICE

(75) Inventor: Heiko Fibranz, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/748,473

(22) Filed: Dec. 26, 2000

Related U.S. Application Data

(63) Continuation of application No. PCT/DE98/01738, filed on Jun. 24, 1998.

(51) Int. Cl.[7] .............................................. G11C 7/00
(52) U.S. Cl. .................. 365/201; 365/189.09; 365/226; 365/230.06; 365/189.11
(58) Field of Search ........................... 365/189.01, 201, 365/226, 230.06, 189.11, 189.09

(56) References Cited

U.S. PATENT DOCUMENTS

| | | | |
|---|---|---|---|
| 5,177,745 A | * 1/1993 | Rozman ................... 371/21.1 |
| 5,596,537 A | 1/1997 | Sukegawa et al. | |
| 5,606,532 A | * 2/1997 | Lambrache et al. ..... 365/238.5 |
| 5,615,159 A | 3/1997 | Roohparvar | |
| 5,650,734 A | * 7/1997 | Chu et al. ...................... 326/38 |
| 5,765,185 A | * 6/1998 | Lambrache et al. ......... 711/103 |
| 5,801,989 A | * 9/1998 | Lee et al. .............. 365/185.22 |
| 6,154,851 A | * 11/2000 | Sher et al. ...................... 714/5 |

FOREIGN PATENT DOCUMENTS

| | | |
|---|---|---|
| EP | 0 594 294 A2 | 4/1994 |
| JP | 411134886 A | * 5/1999 |

* cited by examiner

Primary Examiner—Viet Q. Nguyen
(74) Attorney, Agent, or Firm—Herbert L. Lerner; Laurence A. Greenberg; Werner H. Stemer

(57) ABSTRACT

An electronic memory device (1) having electrically programmable memory cells, an address bus (30) for addressing the memory cells, and also a controllable programming voltage pump (22) for producing a programming voltage for the memory cells. The electronic memory device is distinguished by a switching device (23) which can be actuated by a test mode signal and which can be used to connect the address bus (30) to the programming voltage pump (22) in a test mode such that a prescribable test programming voltage can be set using supplied address bits.

7 Claims, 2 Drawing Sheets

ELECTRONIC MEMORY DEVICE

CROSS-REFERENCE TO RELATED APPLICATION

This is a continuation of copending international application PCT/DE98/01738, filed Jun. 24, 1998, which designated the United States.

BACKGROUND OF THE INVENTION

Field of the Invention

The invention relates to an electronic memory device having electrically programmable memory cells, an address bus for addressing the memory cells, and a controllable programming voltage pump for producing a programming voltage for the memory cells.

Electronic memory devices of this kind are generally produced on a semiconductor chip containing, for example, an EEPROM module (Electrically Erasable Programmable Read-Only Memory) having an EEPROM array and a programmable voltage pump, and also a further module which has decoding and logic circuits and to which the inputs and outputs of the chip are connected. In this context, the memory array represents the actual memory and includes a configuration made up of a plurality of memory cells.

To program the individual EEPROM memory cells, a programming voltage of, for example, 20 V needs to be applied to them, where the programming voltage is much higher than the supply voltage of, for example, 5 V. The optimum programming voltage is obtained on the chip from the supply voltage using the regulated voltage pump.

EP-A 0 594 294 has disclosed an electronic memory device which has electrically programmable memory cells, an address bus for addressing the memory cells and also a controllable programming voltage pump for producing a programming voltage for the memory cells.

After such a semiconductor chip has been manufactured, the EEPROM needs, amongst other things, to be tested for its operability. For this, special programming commands used to program the memory array are provided.

In one of these tests, the programming voltage is lowered to a particular value, for example, in order to check whether the memory cells are just short of being reprogrammed at this programming voltage.

This programming voltage is supplied to the semiconductor chip externally via an additional test pad. This test pad is not required for normal operation of the memory device, however, and takes up chip area which is not available for enlarging the storage capacity, or makes the chip larger than it would actually need to be.

SUMMARY OF THE INVENTION

It is accordingly an object of the invention to provide an electronic memory device of the type mentioned in the introduction in which the aforementioned test pad is not necessary for carrying out the operational test on the memory.

With the foregoing and other objects in view there is provided, in accordance with the invention an electronic memory device including electrically programmable memory cells; an address bus for addressing the memory cells; a controllable programming voltage pump for producing a programming voltage for the memory cells; and a switching device configured for actuation in a test mode by a test mode signal and for connecting the address bus to the programming voltage pump in the test mode such that the programming voltage can be set to a predetermined test programming voltage using address bits supplied on the address bus.

In particular, the electronic memory device mentioned in the introduction is provided with a switching device which can be actuated by means of a test mode signal and can be used to connect the address bus to the programming voltage pump in a test mode such that a predetermined or prescribable test programming voltage can be set using supplied address bits.

One advantage of this solution is that the use of the address bits in the command structure of the chip means that no additional complexity is necessary in the command decoder or in the control logic in order to transmit the nominal variable to the programming voltage pump.

In addition, in the case in which security-related data is stored in the memory, the absence of the test pad removes a point of access for a potential hacker. The test commands can be permanently locked in the chip before it leaves the factory, so that no further manipulation is possible.

Finally, the memory device requires less space on the chip, which means that the storage density of the chip can be increased for the same dimensions, or the chip can be made smaller for the same storage capacity.

Accordingly, the test programming voltage which can be prescribed is, in particular, a voltage at which the memory cells, in the fault-free state, are just short of being reprogrammable.

In accordance with an added feature of the invention, the memory cells preferably form an EEPROM array. However, other memory types in which a programming voltage is required in order to change the memory content and needs to be varied for test purposes are also possible.

In accordance with an additional feature of the invention, the prescribable test programming voltage can be set in the test mode preferably using a programming command.

In accordance with another feature of the invention, the switching device is a multiplexer.

In accordance with a further feature of the invention, the programming voltage pump is regulated, so that a nominal variable for the test programming voltage can be prescribed in the test mode using the address bits.

Other features which are considered as characteristic for the invention are set forth in the appended claims.

Although the invention is illustrated and described herein as embodied in an electronic memory device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
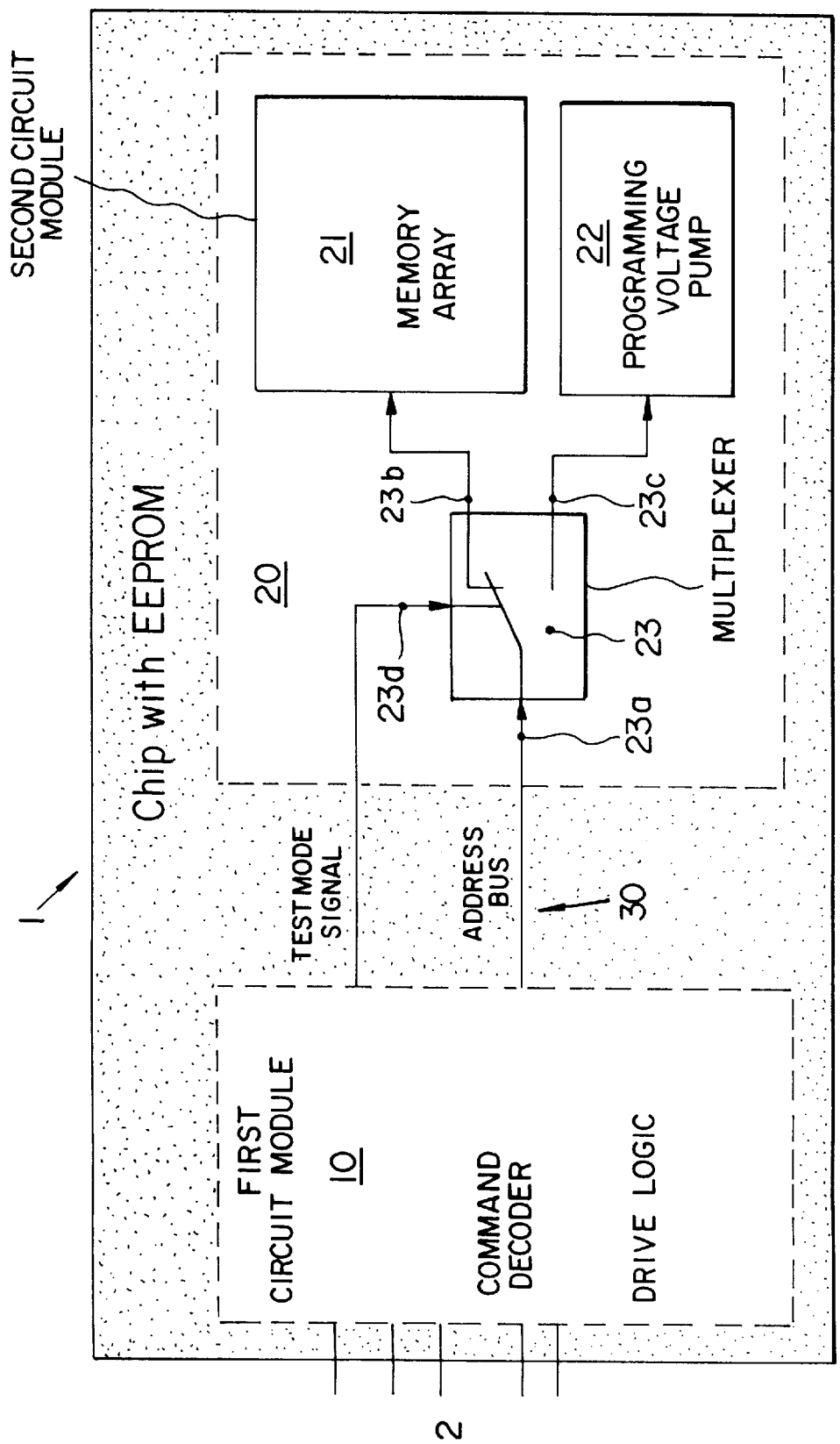
FIG. 1 shows a basic circuit diagram of such an embodiment.

Referring now to the figures of the drawing in detail and first, particularly, to FIG. 1 thereof, there is shown an electronic memory device 1 having inputs and outputs 2, a first circuit module 10 and a second circuit module 20. The electronic memory device 1 also includes an address bus 30 connecting the two circuit modules 10 and 20.

The first circuit module 10 comprises a command decoder and circuits for the drive logic. In addition, the inputs and outputs 2 of the memory device 1 are connected to this module.

The second circuit module 20 contains a memory array 21 with a plurality of individual memory cells, a programming voltage pump with a regulator 22 and also a multiplexer 23, to whose input 23a the address bus 30 is connected. The multiplexer 23 has two outputs 23b, 23c, one of which is connected to the memory array 21 and the other of which is connected to the programming voltage pump 22. The multiplexer 23 fulfills the function of a changeover switch for the address bus 30 connected to its input 23a between the memory array 21 and the programming voltage pump 22. The changeover procedure is controlled by means of a test mode signal supplied to a control input 23d.

After such an electronic memory device 1 has been manufactured, it needs to be tested for fault-free operability. In particular, it is necessary to ensure that the memory cells are reprogrammed only when a prescribed programming voltage is reached, and not beforehand at a much lower voltage. This is because this would present the risk of unintentionally changing the contents of the memory cells if, for example, the supply voltage rises on account of unforeseen circumstances. With an appropriate test, the programming voltage is lowered to a particular value in order to check whether the memory cells are just short of being able to be reprogrammed at this voltage. Since this test involves all the memory cells being examined at once, they do not need to be addressed.

To carry out the test, therefore, the multiplexer 23 is driven via its control input 23d by means of a test mode signal, so that the address bus 30 is now connected to the second output 23c, which is connected to the programming voltage pump 22. Next, the programming voltage is lowered to the predetermined value via the address bus 30, and the address bits then enter the control loop of the programming voltage pump 22 directly and prescribe the new nominal variable for the lowered programming voltage. Finally, the multiplexer 23 is switched back again, and the memory cells can be examined to determine whether their contents have changed.

Setting the programming voltage can easily be implemented in the command structure of the chip.

Figure 2A:
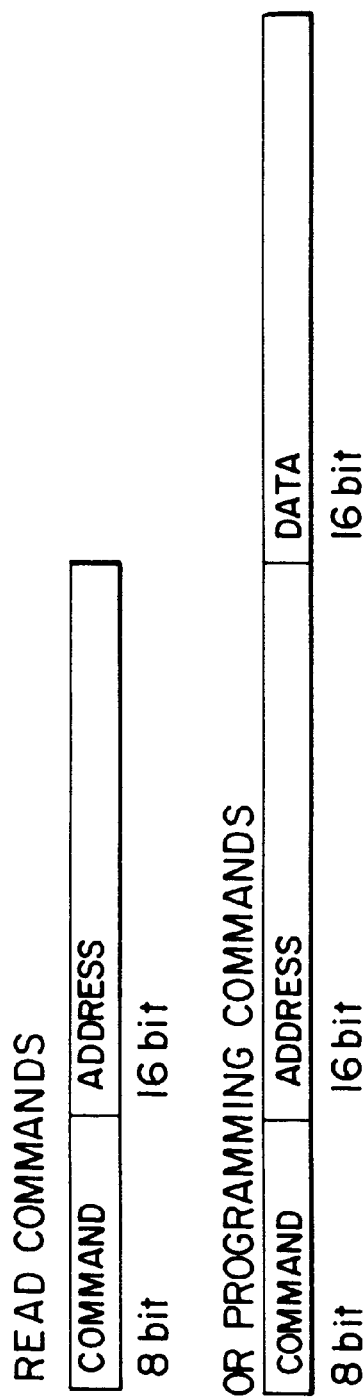
FIGS. 2a and 2b show the structure of various commands to be applied to the circuit shown in FIG. 1.
Figure 2B:

In the case of an inherently known structure (shown in FIG. 2a) of the read and programming commands with command, address and data parts, the programming command in the test mode can have the form shown in FIG. 2b. In this case, bits 8 to 15 of the address part are used to set the test programming voltage, for example, while bits 0 to 7 of the command part can be used for further test mode settings or can be assigned the value "don't care".

I claim:

1. An electronic memory device comprising:

electrically programmable memory cells;

an address bus for addressing said memory cells;

a controllable programming voltage pump for producing a programming voltage for said memory cells; and a switching device configured for actuation in a test mode by a test mode signal and for connecting said address bus to said programming voltage pump in the test mode such that the programming voltage can be set to a predetermined test programming voltage using address bits supplied on said address bus.

2. The electronic memory device according to claim 1, wherein the predetermined test programming voltage is a voltage at which said memory cells, in a fault-free state, are not re-programmable.

3. The electronic memory device according to claim 1, comprising an EEPROM array formed by said memory cells.

4. The electronic memory device according to claim 1, wherein the predetermined test programming voltage can be set in the test mode using a programming command.

5. The electronic memory device according to claim 1, wherein said switching device is a multiplexer.

6. The electronic memory device according to claim 1, wherein said programming voltage pump is a regulated voltage pump, and a predetermined value of the programming voltage can be prescribed in the test mode using the address bits.

7. The electronic memory device according to claim 1, wherein the address bits supplied in the test mode are stored in the memory device as a component part of one or more test programming commands and can be executed as required.

* * * * *